United States Patent
Kim et al.

(10) Patent No.: US 7,756,499 B2
(45) Date of Patent: Jul. 13, 2010

(54) RECEIVER AND AMPLIFICATION-GAIN CONTROLLING DEVICE THEREOF

(75) Inventors: Bonkee Kim, Gyeonggi-do (KR); Bo-Eun Kim, Gyeonggi-do (KR)

(73) Assignee: Integrant Technologies Inc., Gyeonggi-Do (KR)

( * ) Notice: Subject to any disclaimer, the term of this patent is extended or adjusted under 35 U.S.C. 154(b) by 461 days.

(21) Appl. No.: 11/843,322

(22) Filed: Aug. 22, 2007

(65) Prior Publication Data

US 2008/0051050 A1 Feb. 28, 2008

(30) Foreign Application Priority Data

Aug. 22, 2006 (KR) ...................... 10-2006-0079288

(51) Int. Cl.
*H04B 1/06* (2006.01)
*H04L 27/08* (2006.01)

(52) U.S. Cl. .............. 455/234.1; 455/250.1; 455/232.1; 375/345

(58) Field of Classification Search .............. 455/232.1, 455/234.1, 226.2, 240.1, 241.1, 250.1, 67.11, 455/136, 138; 375/345
See application file for complete search history.

(56) References Cited

U.S. PATENT DOCUMENTS

| | | | | |
|---|---|---|---|---|
| 5,999,578 | A * | 12/1999 | Ha | 375/345 |
| 6,035,008 | A * | 3/2000 | Kim | 375/345 |
| 6,498,927 | B2 * | 12/2002 | Kang et al. | 455/245.2 |
| 6,741,844 | B2 * | 5/2004 | Medvid et al. | 455/232.1 |
| 6,885,851 | B1 * | 4/2005 | Miura | 455/234.1 |
| 7,139,542 | B2 * | 11/2006 | Vepsalainen et al. | 455/266 |
| 7,386,074 | B1 * | 6/2008 | Venkatesh et al. | 375/345 |
| 7,565,124 | B2 * | 7/2009 | Lee et al. | 455/234.1 |

* cited by examiner

*Primary Examiner*—Sonny Trinh
(74) *Attorney, Agent, or Firm*—Foley & Lardner, LLP

(57) ABSTRACT

The receiver comprises a variable gain amplification unit, a mixing unit, a filtering unit, and three compensation unit. Each compensation unit detects powers of the signal amplified in the variable gain amplification unit, the signal downconverted in the mixing unit and the signal filtered in the filtering unit. A gain of the variable gain amplification unit is adjusted based on the powers detected by three compensation units.

8 Claims, 5 Drawing Sheets

PRIOR ART

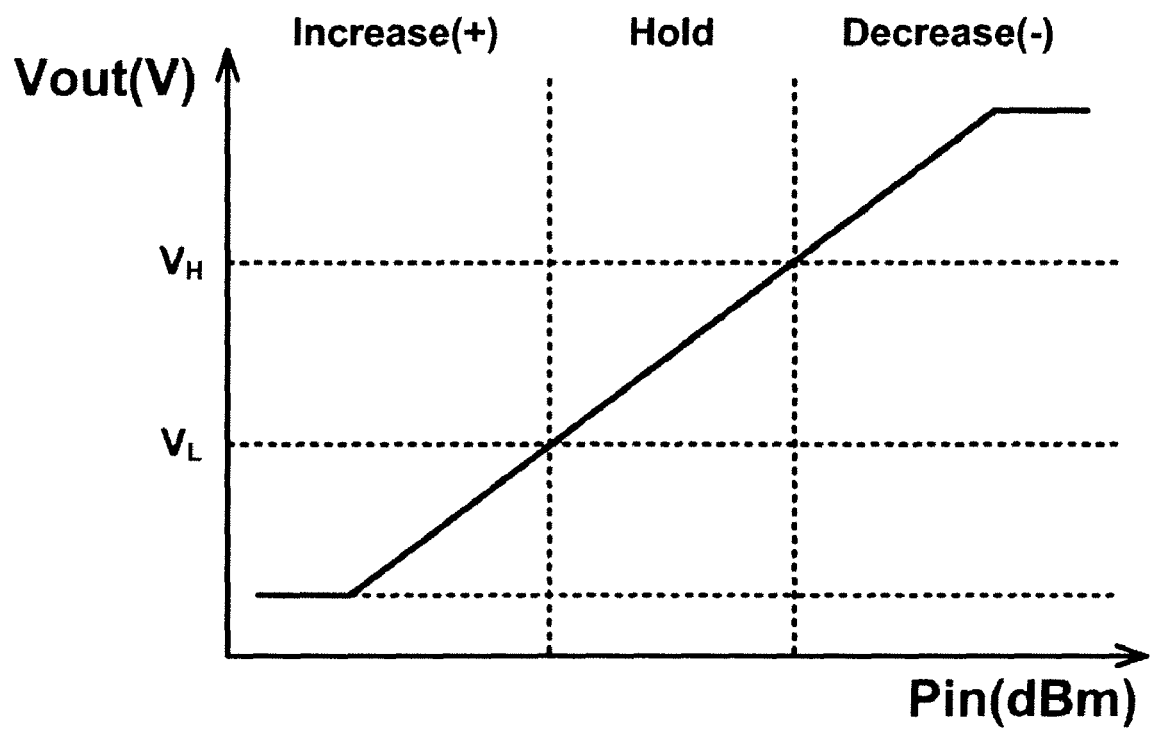

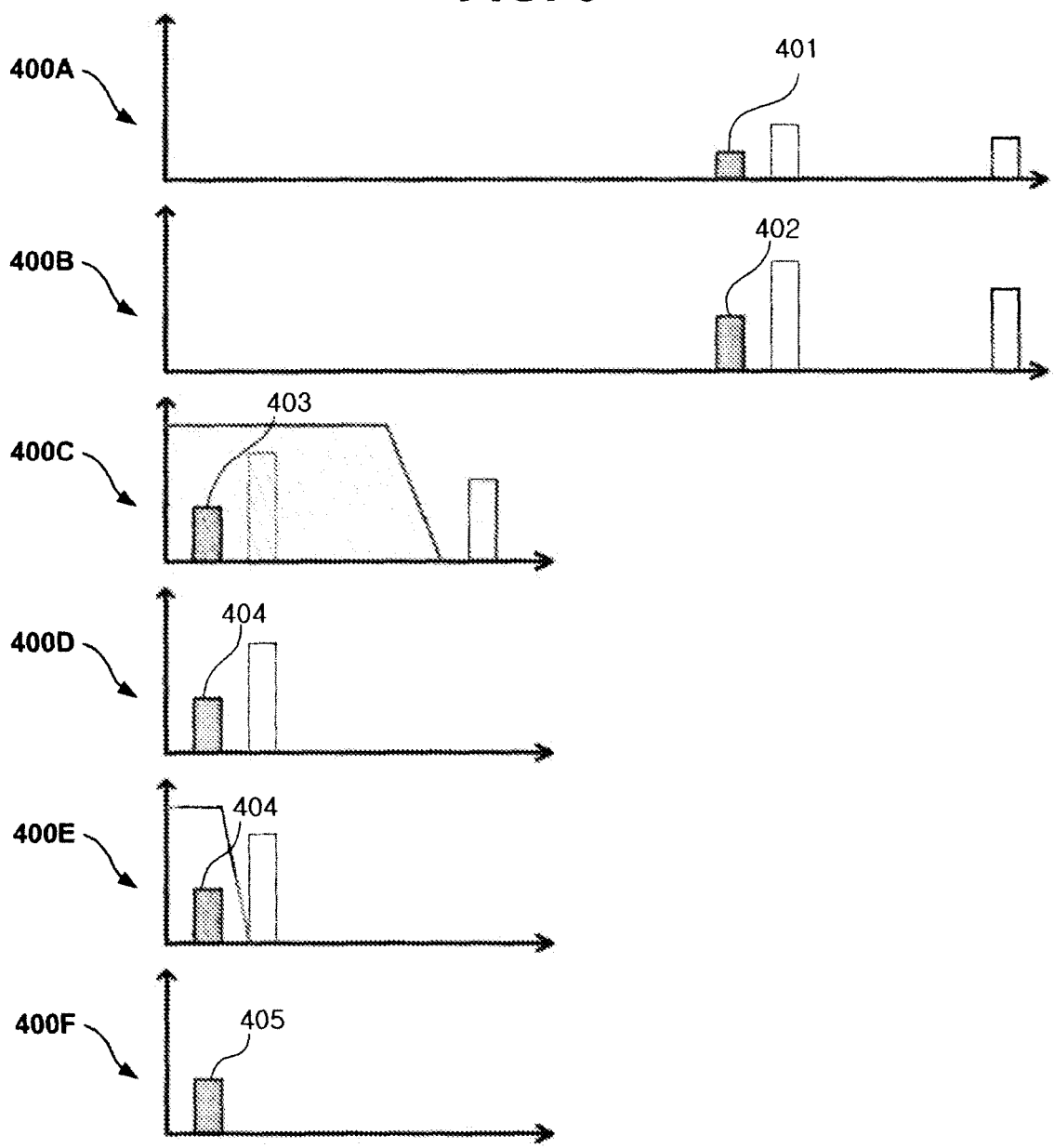

RECEIVER AND AMPLIFICATION-GAIN CONTROLLING DEVICE THEREOF

This nonprovisional application claims priority under 35 U.S.C. §119(a) to patent application No. 10-2006-0079288 filed on Korea on Aug. 22, 2006, the entire contents of which are hereby incorporated by reference.

BACKGROUND OF THE INVENTION

1. Field of the Invention

The present invention relates to a receiver and an amplification-gain controlling device thereof, and more particularly, to a receiver comprising an amplification-gain controlling device for improving reception performance.

2. Description of the Related Art

FIG. 1 is a block diagram illustrating a conventional receiver 100 comprising a automatic gain control circuit. As shown in FIG. 1, the receiver 100 includes a receiving unit 110 and a gain controlling unit 120. The receiving unit 110 includes a low noise amplifier (LNA) 111, an image-rejection mixer (IRM) 112, a low pass filter (LPF) 113, and a variable gain amplifier (VGA) 114. The gain controlling unit 120 includes a gain controller 123, the RF RSSI 121, and a comparator 122.

The LNA 111 amplifies a received signal while suppressing amplification of a noise of the received signal. The IRM 112 processes the signal by image rejection and down conversion, filters an image frequency, and removes parasitic frequencies. In other words, the IRM 112 separates an RF stage and an intermediate frequency (IF) stage and thus, secures stability of the receiving unit 110. The LPF 113 is constructed to filter a specific low band. The filtered signal is again amplified in the VGA 114. Here, the LNA 111 is not enough to amplify a weak reception signal. Therefore, a circuit construction is provided to control and amplify with an arbitrary gain using the VGA 114 for precise power control. By these all processes, an intermediate frequency signal which is amplified and has no image frequency component is outputted.

The gain controller 123 outputs a control signal for adjusting each gain of the LNA 111, the IRM 112, and the VGA 114. The RF RSSI 121 detects a strength of the signal outputted from the LPF 113. The comparator 122 of the gain controlling unit 120 sends a value for adjusting the gain to the gain controller 123 on the basis of the strength of the signal detected in the RF RSSI 121.

Because an input signal power is detected from an LPF output signal, an RF automatic gain control (AGC) loop detects a power of only a desired channel, thereby controlling a gain of a gain stage of the RF AGC loop. The RF AGC loop is comprised of the LNA 111, the IRM 112, the LPF 113, the VGA 114, the RF RSSI 121, the comparator 122, and the gain controller 123. In such case, in case where a small signal is inputted to a desired channel and a large noise signal is applied to an undesired channel together, the LNA 111 gets to be in a saturation state at the time of amplifying the small signal of the desired channel, thereby making it impossible for the receiver 100 to perform normal operation.

SUMMARY OF THE INVENTION

Accordingly, the present invention is to provide a receiver comprising an amplification-gain controlling device for improving reception performance of the receiver.

In one aspect, there is provided a receiver. The receiver comprises a variable gain amplification unit, a mixing unit, a filtering unit, a first compensation unit, and a second compensation unit. The variable gain amplification unit amplifies or attenuates a radio frequency (RF) signal depending on a magnitude of an input signal. The mixing unit processes, by down conversion, the signal amplified in the variable gain amplification unit. The filtering unit filters the signal down-converted in the mixing unit. The first compensation unit detects a power of the signal amplified in the variable gain amplification unit and outputs a first control signal. The second compensation unit detects a strength of the signal down-converted in the mixing unit and outputs a second control signal. The third compensation unit detects a strength of the signal filtered in the filtering unit and outputs a third control signal. A gain of the variable gain amplification unit is varied by the first control signal, the second control signal, and the third control signal.

The first compensation unit may comprise a power detector and a first comparator. The power detector detects the power of the signal amplified in the variable gain amplification unit. The first comparator compares a power detection signal level detected in the power detector with a first reference signal level, and outputs the first control signal.

The second compensation unit may comprise a first received signal strength indicator and a second comparator. The first received signal strength indicator detects the strength of the signal down-converted in the mixing unit. The second comparator compares a first reception strength detection signal level detected in the first received signal strength indicator with a second reference signal level.

The third compensation unit may comprise a second received signal strength indicator and a third comparator. The second received signal strength indicator detects the strength of the signal filtered in the filtering unit. The third comparator compares a second reception strength detection signal level detected in the second received signal strength indicator with a third reference signal level.

The variable gain amplification unit may comprise a low noise amplifier and a gain amplifier.

The mixing unit may comprise a mixer and a first filter. The mixer down-converts the radio frequency signal. The first filter filters the signal down-converted in the mixer.

The receiver may further comprise a gain controller. The gain controller receives the first control signal, the second control signal, and the third control signal and varies the gain of the variable gain amplification unit.

In another aspect, there is provided an amplification-gain controlling device for controlling a gain of a variable gain amplification unit of a receiver comprising the variable gain amplification unit, a mixing unit, and a filtering unit. The device comprises a first compensation unit, a second compensation unit, and a third compensation unit. The first compensation unit detects a power of a signal amplified in the variable gain amplification unit and outputs a first control signal. The second compensation unit detects a strength of the signal down-converted in the mixing unit and outputs a second control signal. The third compensation unit detects a strength of the signal filtered in the filtering unit and outputs a third control signal. The gain of the variable gain amplification unit is varied by the first control signal, the second control signal, and the third control signal.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like numerals refer to like elements.

FIG. 4 is a graph for describing operation of first to third compensation units of a receiver according to an exemplary embodiment of the present invention; and FIG. 5 is graphs for schematically describing operation of a receiving unit and detection power of a gain controlling unit in a receiver according to an exemplary embodiment of the present invention.

DETAILED DESCRIPTION OF PREFERRED EMBODIMENTS

Figure 1:
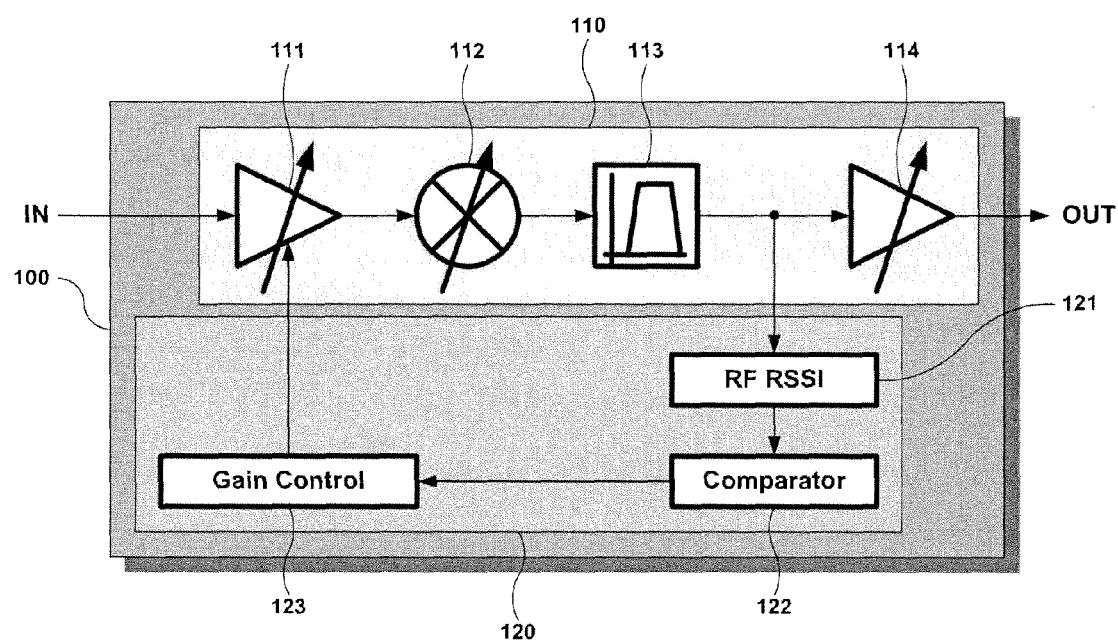
FIG. 1 is a block diagram illustrating a conventional receiver comprising a automatic gain control circuit.

Advantages and features of the present invention and a method for accomplishing them will be apparent by a detailed description of exemplary embodiments below together with the accompanying drawings.

However, the present invention is not limited to exemplary embodiments disclosed below, but can be realized in different various forms. The exemplary embodiments of the present invention are simply provided to make the entire disclosure of the present invention and the entire scope of the present invention to be understood by those skilled in the art. The present invention is only defined by the scope of claims. Like reference numerals denote like elements throughout the specification.

Preferred embodiments of the present invention will be described in a more detailed manner with reference to the drawings.

Figure 2:
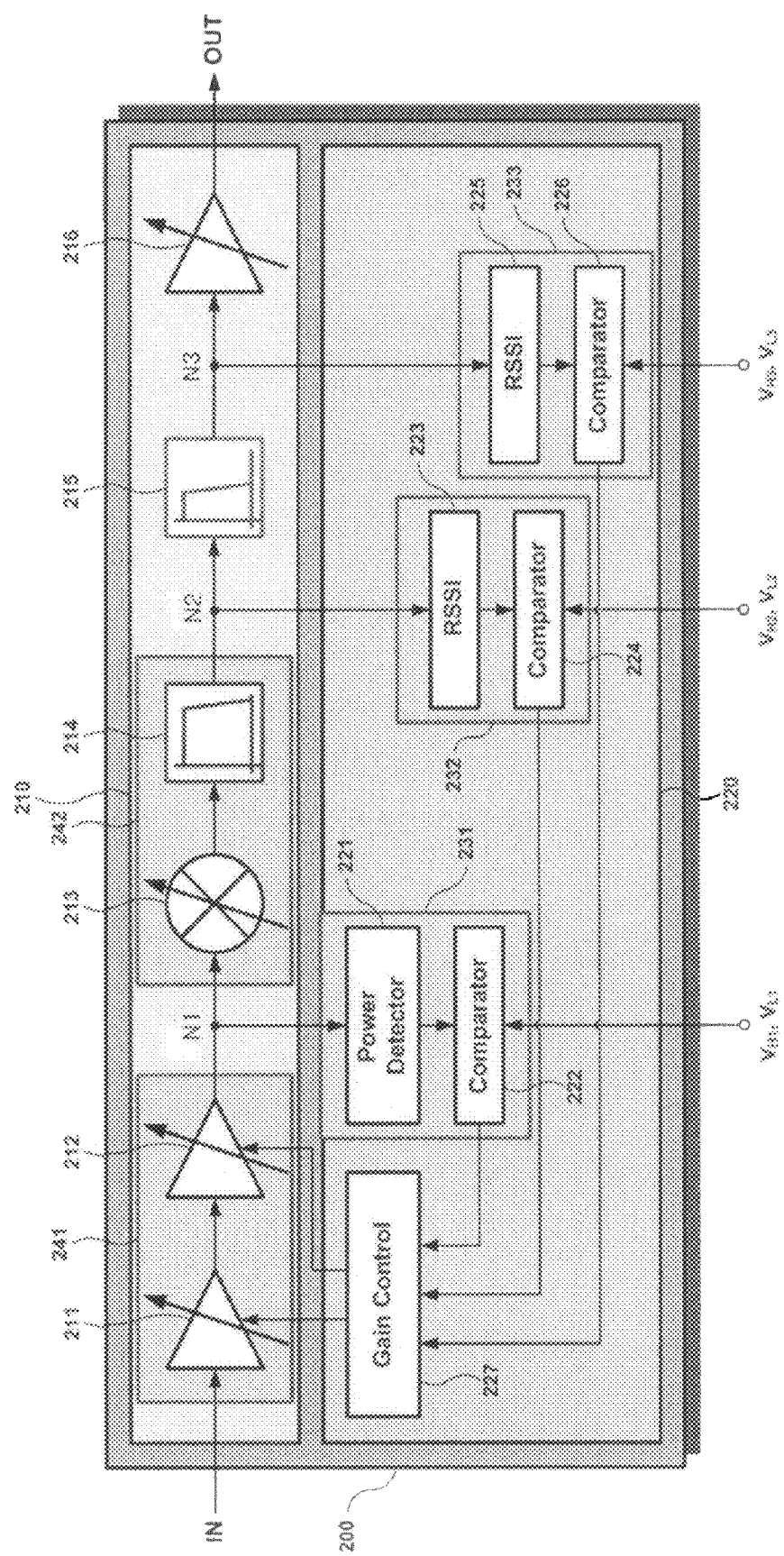
FIG. 2 is a block diagram illustrating a receiver according to an exemplary embodiment of the present invention.

FIG. 2 is a block diagram illustrating a receiver according to an exemplary embodiment of the present invention. As shown in FIG. 2, the receiver 200 according to an exemplary embodiment of the present invention comprises a receiving unit 210 and a gain controlling unit 220.

Construction of the receiver 200 according to an exemplary embodiment of the present invention will be described below.

The receiving unit 210 comprises a variable gain amplification unit 241, a mixing unit 242, a filtering unit 215, and a variable gain amplifier 216. It is desirable that the variable gain amplification unit 241 comprises a low noise amplifier 211 and a gain amplifier 212. It is desirable that the mixing unit 242 comprises a mixer 213 and a first filter 214.

The gain controlling unit 220 comprises a first compensation unit 231, a second compensation unit 232, a third compensation unit 233, and a gain controller 227. The first compensation unit 231 comprises a RF power detector 221 and a first comparator 222. The second compensation unit 232 comprises a first RSSI (Received Signal Strength Indicator) 223 and a second comparator 224. The third compensation unit 233 comprises a second RSSI 225 and a third comparator 226.

Connection relationship in the receiver 200 according to an exemplary embodiment of the present invention will be described below.

The variable gain amplification unit 241 receives a radio frequency signal (IN) through its input terminal. The output terminal of the variable gain amplification unit 241 is connected to a first node (N1). The input terminal of the mixing unit 242 is connected to the first node (N1). The output terminal of the mixing unit 242 is connected to a second node (N2). The input terminal of the filtering unit 215 is connected to the second node (N2). The output terminal of the filtering unit 215 is connected to a third node (N3). The input terminal of the variable gain amplifier 216 is connected to the third node (N3). The variable gain amplifier 216 outputs an intermediate frequency (OUT) through its output terminal.

The input terminal of the RF power detector 221 is connected to the first node (N1). The output terminal of the RF power detector 221 is connected to an input terminal of the first comparator 222. The first comparator 222 receives a first reference signal through its control input terminal. The output terminal of the first comparator 222 is connected to a first input terminal of the gain controller 227.

The input terminal of the first RSSI 223 is connected to the second node (N2). The output terminal of the first RSSI 223 is connected to an input terminal of the second comparator 224. The second comparator 224 receives a second reference signal through its control input terminal. The output terminal of the second comparator 224 is connected to a second input terminal of the gain controller 227.

The input terminal of the second RSSI 225 is connected to the third node (N3). The output terminal of the second RSSI 225 is connected to an input terminal of the third comparator 226. The third comparator 226 receives a third reference signal through its control input terminal. The output terminal of the third comparator 226 is connected to a third input terminal of the gain controller 227.

The first output terminal and the second output terminal of the gain controller 227 is connected to a gain control terminal of the variable gain amplification unit 241.

Operation of the receiver 200 according to an exemplary embodiment of the present invention will be described below.

The variable gain amplification unit 241 amplifies or attenuates a radio frequency signal (IN). In the variable gain amplification unit 241, the low noise amplifier 211 amplifies the radio frequency signal (IN) while minimizing a noise of the radio frequency signal (IN) The gain amplifier 212 amplifies the radio frequency signal (IN) amplified in the low noise amplifier 211 using a programmable gain amplifier.

The RF power detector 221 detects a level of the radio frequency signal (IN) amplified in the gain amplifier 212 and outputs a power detection signal ($V_{OUT1}$) level. The first comparator 222 compares a first reference signal level with the power detection signal ($V_{OUT1}$) level outputted from the RF power detector 221 and applies a first control signal to the first input terminal of the gain controller 227. The first reference signal is a signal comprising a first high signal ($V_{H1}$) and a first low signal ($V_{L1}$) provided from the exterior.

The mixing unit 242 mixes the radio frequency signal (IN) amplified by the gain amplifier 212 with a local frequency oscillated by a local oscillator (not shown) and processes the signal by down conversion to an intermediate frequency (IF) signal. The mixing unit 242 further comprises the first filter 214 for filtering off a signal not adjacent to the down-converted intermediate frequency signal.

The first RSSI 223 outputs a first reception strength detection signal ($V_{OUT2}$) level of the signal outputted from the mixing unit 242. The second comparator 224 compares a second reference signal level with the first reception strength detection signal ($V_{OUT2}$) level outputted from the first RSSI 223 and applies a second control signal to the second input terminal of the gain controller 227. The second reference signal is a signal comprising a second high signal ($V_{H2}$) and a second low signal ($V_{L2}$) provided from the exterior.

The filtering unit 215 filters only a signal intended for reception.

The second RSSI 225 outputs a second reception strength detection signal ($V_{OUT3}$) level of a signal intended for reception. The third comparator 226 compares a third reference signal level with the second reception strength detection signal ($V_{OUT3}$) level outputted from the second RSSI 225 and applies a third control signal to the third input terminal of the gain controller 227. The third reference signal is a signal comprising a third high signal ($V_{H3}$) and a third low signal ($V_{L3}$) provided from the exterior.

The gain controller 227 controls a gain of the variable gain amplification unit 241 using the first to third control signals applied to the first to third input terminals. A detailed description of operation of the first to third comparators 222, 224, and 226 will be made with reference to FIGS. 3A to 3C.

Figure 3A:
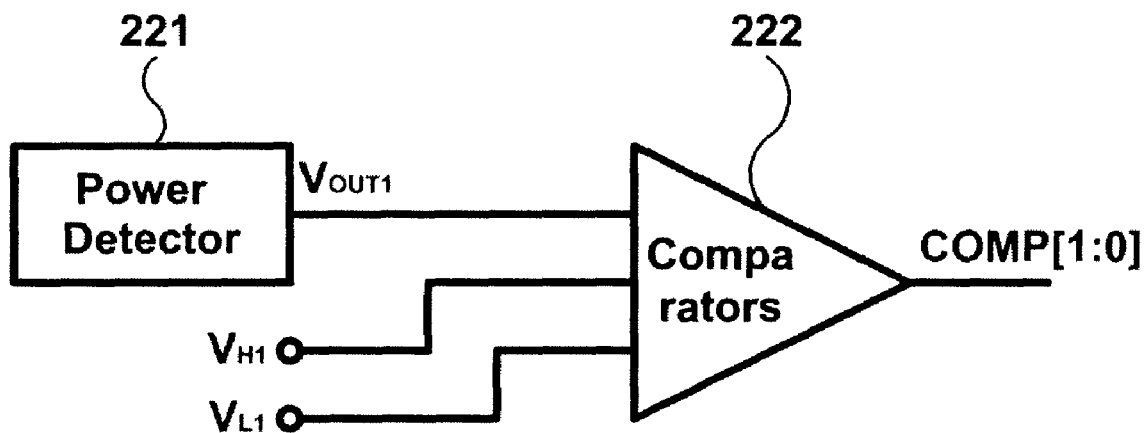
FIG. 3A is a block diagram illustrating a first compensation unit of a receiver according to an exemplary embodiment of the present invention.

FIG. 3A is a block diagram illustrating the first compensation unit 231 of the receiver according to an exemplary embodiment of the present invention. As shown in FIG. 3A, the first compensation unit 231 of the receiver comprises the RF power detector 221 and the first comparator 222. The RF power detector 221 detects and outputs the power detection signal ($V_{OUT1}$). The power detection signal ($V_{OUT1}$) level is divided into an increase zone, a hold zone, and a decrease zone. The first comparator 222 compares the power detection signal ($V_{OUT1}$) level with the first high signal ($V_{H1}$) level and the first low signal ($V_{L1}$) level and outputs a first control signal value so that the gain controller 227 controls a gain of the variable gain amplification unit 241. If the power detection signal ($V_{OUT1}$) level is equal to or lower than the first low signal ($V_{L1}$), the first comparator 222 outputs the control signal which represents that the power detection signal ($V_{OUT1}$) level is in the increase zone. If the power detection signal ($V_{OUT1}$) level exists between the first low signal ($V_{L1}$) and the first high signal($V_{H1}$), the first comparator 222 outputs the control signal which represents that the power detection signal ($V_{OUT1}$) level is in the hold zone. If the power detection signal ($V_{OUT1}$) level is equal to or higher than the first high signal ($V_{H1}$), the first comparator 222 outputs the control signal which represents that the power detection signal ($V_{OUT1}$) level is in the decrease zone.

Figure 3B:
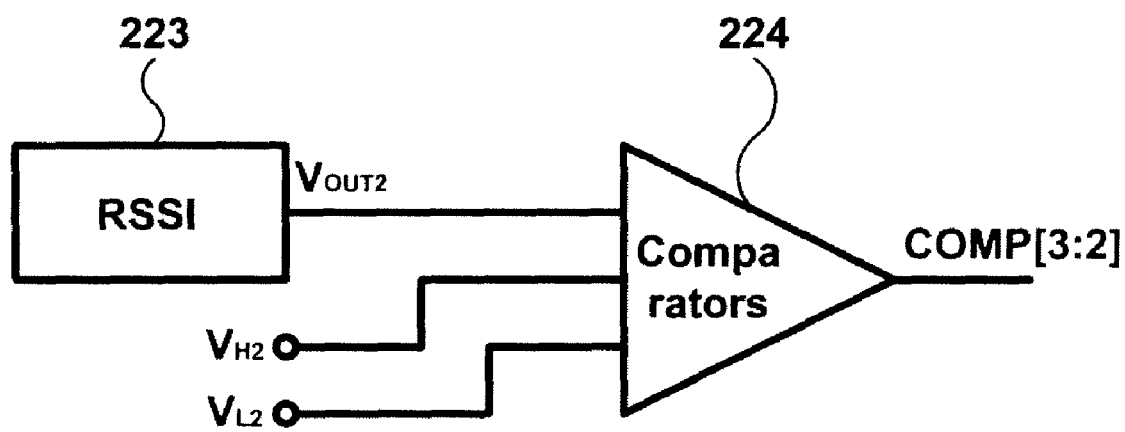
FIG. 3B is a block diagram illustrating a second compensation unit of a receiver according to an exemplary embodiment of the present invention.

FIG. 3B is a block diagram illustrating the second compensation unit 232 of a receiver according to an exemplary embodiment of the present invention. As shown in FIG. 3B, the second compensation unit 232 of the receiver comprises the first RSSI 223 and the second comparator 224. The first RSSI 223 detects and outputs the first reception strength detection signal ($V_{OUT2}$). The first reception strength detection signal ($V_{OUT2}$) level is divided into an increase zone, a hold zone, and a decrease zone. The second comparator 224 compares the first reception strength detection signal ($V_{OUT2}$) level with the second high signal ($V_{H2}$) level and the second low signal ($V_{L2}$) level and outputs a second control signal value so that the gain controller 227 controls a gain of the variable gain amplification unit 241. If the first reception strength detection signal ($V_{OUT2}$) level is equal to or lower than the second low signal ($V_{L2}$), the second comparator 224 outputs the control signal which represents that the first reception strength detection signal ($V_{OUT2}$) level is in the increase zone. If the first reception strength detection signal ($V_{OUT2}$) level exists between the second low signal ($V_{L2}$) and the second high signal ($V_{H2}$), the second comparator 224 outputs the control signal which represents that the first reception strength detection signal ($V_{OUT2}$) level is in the hold zone. If the first reception strength detection signal ($V_{OUT2}$) level is equal to or higher than the second high signal ($V_{H2}$), the second comparator 224 outputs the control signal which represents that the first reception strength detection signal ($V_{OUT2}$) level is in the decrease zone.

Figure 3C:
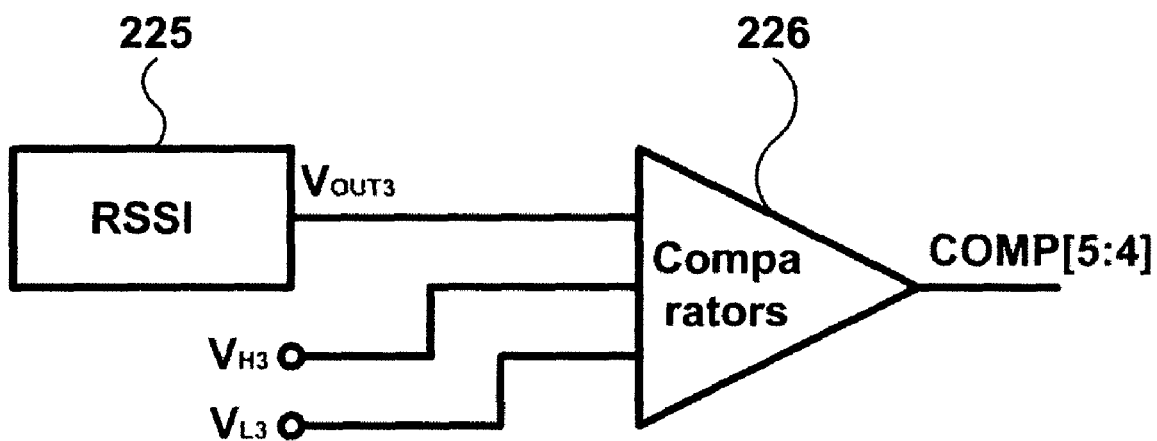
FIG. 3C is a block diagram illustrating a third compensation unit of a receiver according to an exemplary embodiment of the present invention.

FIG. 3C is a block diagram illustrating the third compensation unit 233 of the receiver according to an exemplary embodiment of the present invention. As shown in FIG. 3C, the third compensation unit 233 of the receiver comprises the second RSSI 225 and the third comparator 226. The second RSSI 225 detects and outputs the second reception strength detection signal ($V_{OUT3}$). The second reception strength detection signal ($V_{OUT3}$) level is divided into an increase zone, a hold zone, and a decrease zone. The third comparator 226 compares the second reception strength detection signal ($V_{OUT3}$) level with the third high signal ($V_{H3}$) level and the third low signal ($V_{L3}$) level and outputs a third control signal value so that the gain controller 227 controls a gain of the variable gain amplification unit 241. If the second reception strength detection signal ($V_{OUT3}$) level is equal to or lower than the third low signal ($V_{L3}$), the third comparator 226 outputs the control signal which represents that the second reception strength detection signal ($V_{OUT3}$) level is in the increase zone. If the second reception strength detection signal ($V_{OUT3}$) level exists between the third low signal ($V_{L3}$) and the third high signal ($V_{H3}$), the third comparator 226 outputs the control signal which represents that the second reception strength detection signal ($V_{OUT3}$) level is in the hold zone. If the second reception strength detection signal ($V_{OUT3}$) level is equal to or higher than the third high signal ($V_{H3}$), the third comparator 226 outputs the control signal which represents that the second reception strength detection signal ($V_{OUT3}$) level is in the decrease zone.

FIG. 4 is a graph for describing operation of the first to third compensation units 231, 232, and 233 of the receiver according to an exemplary embodiment of the present invention. As shown in FIG. 4, the increase zone, the hold zone, and the decrease zone are comprised in the graph for describing the operation of the first to third compensation units 231, 232, and 233 of the receiver according to an exemplary embodiment of the present invention. In detail, FIG. 4 is a graph for detection signal ($V_{OUT}$) versus input power ($P_{in}$), each detected and outputted from the RF power detector 221, the first RSSI 223, and the second RSSI 225. The detection signal ($V_{OUT}$) can be mapped to the power detection signal ($V_{OUT1}$), the first reception strength detection signal ($V_{OUT2}$), and the second reception strength detection signal ($V_{OUT3}$). For convenience of explanation, increase zone, hold zone and decrease zone of each of the power detection signal ($V_{OUT1}$), the first reception strength detection signal ($V_{OUT2}$), and the second reception strength detection signal ($V_{OUT3}$) are represented in one graph, they are defined independently each other. Depending on which zone each of the power detection signal ($V_{OUT1}$), the first reception strength detection signal ($V_{OUT2}$), and the second reception strength detection signal ($V_{OUT3}$) exists in, the control signal is outputted from the gain controller 227 so that the gain of variable gain amplification unit 241 is adjusted. For example, if at least one among the power detection signal ($V_{OUT1}$), the first reception strength detection signal ($V_{OUT2}$), and the second reception strength detection signal ($V_{OUT3}$) is in the decrease zone, the gain controller 227 decreases the gain of the variable gain amplification unit 241. Furthermore, in case that none of the power detection signal ($V_{OUT1}$), the first reception strength detection signal ($V_{OUT2}$), and the second reception strength detection signal ($V_{OUT3}$) is in the decrease zone and at least one among the power detection signal ($V_{OUT1}$), the first reception strength detection signal ($V_{OUT2}$), and the second reception strength detection signal ($V_{OUT3}$) is in the hold zone, the gain controller 227 maintain the gain of the variable gain amplification unit 241. Furthermore, all of the power detection signal ($V_{OUT1}$), the first reception strength detection signal ($V_{OUT2}$), and the second reception strength detection signal ($V_{OUT3}$) is in the increase zone, the gain controller 227 increase the gain of the variable gain amplification unit 241. FIG. 5 is graphs for schematically describing operation of the receiving unit 210 and detection power of the gain controlling unit 220 in the receiver 200 according to an exemplary embodiment of the present invention. As shown in FIG. 5, a radio frequency signal (IN) 401 is applied to the input terminal of the receiver 200 (400A). Here, the variable gain amplification unit 241 of the receiver 200 amplifies the radio frequency signal (IN) while decreasing a noise of the radio frequency signal (IN) and. The RF power detector 221 detects a power of the radio frequency signal (IN) 402 amplified by the variable gain amplification unit 241 (400B). This construction enables the receiver 200 to implement a stable operation. Here, the mixer 213 processes the radio frequency signal (IN) 402 by down conversion to an intermediate frequency signal (IF) 403. The first filter 214 filters only a broad low band of the intermediate frequency signal (IF) mixed by the mixer 213 to remove a signal not adjacent to the radio frequency signal (IN) (400C). The first RSSI 223 detects a power of the intermediate frequency signal (IF) 404 filtered by the first filter 214 (400D). This construction enables passing of the intermediate frequency signal (IF) while preventing the detection of a power of a signal far away from the radio frequency signal (IN) intended for reception. The second filter 215 filters only a narrow low band of the intermediate frequency (IF) signal 404 to remove signals other than the radio frequency signal (IF) (400E). The second RSSI 225 detects a power of the intermediate frequency signal (IF) filtered by the second filter 215 (400F). This construction enables passing of the intermediate frequency signal (IF) with the narrow low band and detection of only a power of the radio frequency signal (IN) intended for reception.

According to the present invention as above, there is an effect of improving a reception performance of the receiver by using an amplification-gain controlling device. The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A receiver comprising:
a variable gain amplification unit for amplifying or attenuating a radio frequency signal depending on a magnitude of an input signal;
a mixing unit for processing, by down conversion, the signal amplified by the variable gain amplification unit;
a filtering unit for filtering the signal down-converted by the mixing unit;
a first compensation unit for detecting a power of the signal amplified by the variable gain amplification unit and outputting a first control signal;
a second compensation unit for detecting a strength of the signal down-converted by the mixing unit and outputting a second control signal; and
a third compensation unit for detecting a strength of the signal filtered by the filtering unit and outputting a third control signal,
wherein a gain of the variable gain amplification unit is varied by the first control signal, the second control signal, and the third control signal.

2. The receiver of claim 1, wherein the first compensation unit comprises:
a power detector for detecting the power of the signal amplified by the variable gain amplification unit; and
a first comparator for comparing a power detection signal level detected by the power detector with a first reference signal level, and outputting the first control signal.

3. The receiver of claim 1, wherein the second compensation unit comprises:
a first received signal strength indicator for detecting the strength of the signal down-converted by the mixing unit; and
a second comparator for comparing a first reception strength detection signal level detected by the first received signal strength indicator with a second reference signal level.

4. The receiver of claim 1, wherein the third compensation unit comprises:
a second received signal strength indicator for detecting the strength of the signal filtered by the filtering unit; and
a third comparator for comparing a second reception strength detection signal level detected by the second received signal strength indicator with a third reference signal level.

5. The receiver of claim 1, wherein the variable gain amplification unit comprises a low noise amplifier and a gain amplifier.

6. The receiver of claim 1, wherein the mixing unit comprises:
a mixer for down-converting the radio frequency signal; and
a first filter for filtering the signal down-converted by the mixer.

7. The receiver of claim 1, further comprising: a gain controller for receiving the first control signal, the second control signal, and the third control signal and varying the gain of the variable gain amplification unit.

8. An amplification-gain controlling device for controlling a gain of a variable gain amplification unit by a receiver comprising the variable gain amplification unit, a mixing unit, and a filtering unit, the device comprising:
a first compensation unit for detecting a power of a signal amplified by the variable gain amplification unit and outputting a first control signal;
a second compensation unit for detecting a strength of the signal down-converted by the mixing unit and outputting a second control signal; and
a third compensation unit for detecting a strength of the signal filtered by the filtering unit and outputting a third control signal,
wherein the gain of the variable gain amplification unit is varied by the first control signal, the second control signal, and the third control signal.

* * * * *